United States Patent [19]

Auvinen

[11] Patent Number: 4,975,879

[45] Date of Patent: Dec. 4, 1990

[54] BIASING SCHEME FOR FIFO MEMORIES

[75] Inventor: Stuart T. Auvinen, Santa Cruz, Calif.

[73] Assignee: Advanced Micro Devices, Inc., Sunnyvale, Calif.

[21] Appl. No.: 380,369

[22] Filed: Jul. 17, 1989

[51] Int. Cl.[5] .................... G11C 11/40; G11C 11/702
[52] U.S. Cl. .............................. 365/189.09; 365/206; 365/204; 365/190; 307/296.1
[58] Field of Search ................... 365/189.09, 205, 204, 365/189.05, 226, 189.06, 190, 189.11; 307/296.1, 296.2

[56] References Cited

U.S. PATENT DOCUMENTS

| | | | |
|---|---|---|---|
| 4,542,485 | 9/1985 | Iwahashi et al. | 365/189.09 |
| 4,739,499 | 4/1988 | Simpson | 365/205 |
| 4,740,926 | 4/1988 | Takemae et al. | 365/189.09 X |
| 4,817,055 | 3/1989 | Arakawa et al. | 365/189.09 |

*Primary Examiner*—Alyssa H. Bowler
*Attorney, Agent, or Firm*—Davis Chin

[57] ABSTRACT

A biasing circuit for use with memory cells in intermittent memories includes means coupled between first and second bit-lines for biasing continuously the first and second bit-lines during a read operation so as to compensate for any leakage of charge without consumption any power. The biasing means is formed of an N-channel MOS biasing transistor (M1) and a cross-coupled half-latch circuit formed of a first P-channel MOS transistor (M2) and a second P-channel MOS transistor (M3).

3 Claims, 1 Drawing Sheet

BIASING SCHEME FOR FIFO MEMORIES

BACKGROUND OF THE INVENTION

This invention relates generally to memory cell circuits and more particularly, it relates to a biasing circuit for intermittent memories, such as a first-in first-out (FIFO) memory array, in which the bit lines in the array are continuously biased so as to compensate for leakage current without consuming any power.

In general, memories can suffer failures due to loss of data stored in cells when they do not have fixed cycle times. Assuming that such data stored in the memory cells are needed to be read, a read row line is typically activated so as to connect the memory cells to a pair of read bit-lines. Thus, the data stored in the cells will be transferred to the bit-lines. A failure may occur during this read cycle if leakage is present on the bit-lines. This is because all of the charges on the bit-lines and the memory cells could be leaked away, thereby resulting in a loss of data in the memory cells.

Since the problem of leakage is a relatively slow process as compared to the normal read access times, a failure will not occur if the read cycle ends quickly enough. Therefore, the leakage problem is only encountered by intermittent memories, such as FIFO memories, which allows the read cycle to occur over an indefinite amount of time.

There are known two prior art solutions to this problem. One approach is to cause the read cycle to end a fixed amount of time after the cycle begins. However, this requires the use of a clock or timing circuit inside the memory array to end the cycle. The internal clock for this approach is not only complex, but is sensitive to variations due to temperature, processing and supply voltage.

A second approach which has been employed on a 1k×9 deep FIFO memory is to actively bias the bit-lines with a pair of transistors, as shown in FIG. 1. These transistors N4, N5 are designed so as to supply more current to the bit-lines than can be leaked off. Unfortunately, the problem with this approach has been that one of the pair of transistors is biasing high the bit-line that the memory cell is holding "low" during the read cycle. As a result, there is provided a direct current path to ground which causes power dissipation. While this transistor can be made weak so as to minimize the power drain, this suffers from the disadvantage that the transistor must be made large, thereby increasing expense and occupying more chip area.

The present invention represents an improvement over the second approach in which only one of the pair of bit-lines is biased, the bit-line that the memory cell is holding "high" during the read cycle. The other bit-line that the memory cell is holding "low" is not biased at all. Thus, no power dissipation will occur.

SUMMARY OF THE INVENTION

Accordingly, it is a general object of the present invention to provide an improved biasing circuit for intermittent memories which is relatively simple and economical to manufacture and assemble, but yet overcomes the disadvantage of the prior art biasing circuits.

It is an object of the present invention to provide a biasing circuit for intermittent memories so as to compensate for leakage current without consuming any power.

It is another object of the present invention to provide a biasing circuit for use with memory cells in intermittent memories which includes an N-channel MOS biasing transistor and a cross-coupled half-latch circuit to continuously bias the bit-lines during a read operation so as to compensate for leakage.

In accordance with these aims and objectives, the present invention is concerned with the provision of a biasing circuit for use with memory cells in intermittent memories in which data can be written into and sensed in the memory cell which includes a memory cell, an N-channel MOS biasing transistor, and a cross-coupled half-latch circuit. The memory cell is coupled with a word line and between first and second bit-lines at corresponding first and second sense nodes. The N-channel transistor has its gate and drain connected to a supply potential. The cross-coupled half-latch circuit is formed of a first P-channel MOS transistor and a second P-channel MOS transistor. The first P-channel transistor has its source connected to the sources of the second P-channel transistor and the N-channel transistor. The first P-channel transistor has its gate connected to the drain of the second P-channel transistor and to the second bit-line. The second P-channel transistor has its gate connected to the drain of the first P-channel transistor and to the first bit-line.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
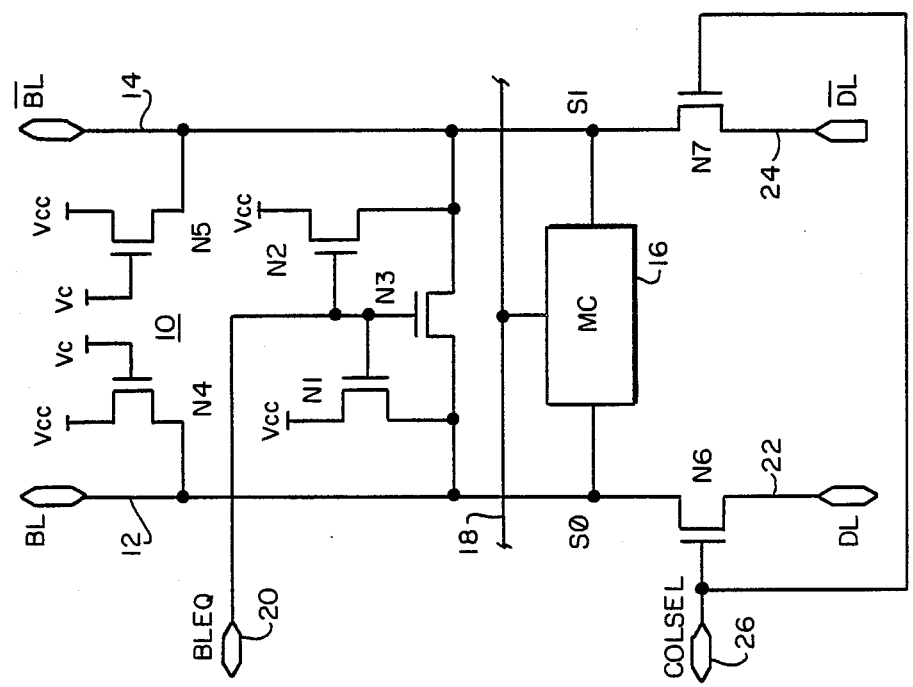
FIG. 1 is a schematic circuit diagram of a prior art biasing circuit for biasing a pair of bit-lines.

Referring now to FIG. 1 of the drawings, there is shown a schematic circuit diagram of a prior art biasing circuit 10 for biasing a pair of bit-lines 12, 14. A memory cell 16 is connected with a word line 18 and is connected between the first bit-line 12 at a sense node $S\phi$ and the second bit-line 14 at a second sense node S1. An equilibration circuit is formed of N-channel MOS transistors N1, N2, and N3. The transistor N1 has its drain connected to a supply voltage or potential VCC and its source connected to the bit-line 12. The transistor N2 has its drain connected to the supply potential VCC and its source connected to the bit-line 14. The transistor N3 has its drain and source connected between the bit-lines 12 and 14, respectively. The gates of the transistors N1, N2 and N3 are connected together and to an input node 20 which receives an equilibration signal BLEQ. When the equilibration signal BLEQ is at a high logic or "1" level, the transistors N1–N3 are turned on, thereby connecting the bit-lines 12 and 14 together so as to settle at an equilibration voltage.

Each of the bit-lines 12, 14 is provided with a column transistor N6, N7 for routing data into and out of the memory cell 16. A transistor N6 has it drain and source connected between the first sense node $S\phi$ and a true data line 22. The transistor N7 has its drain and source connected between the second sense node S1 and a complementary data line 24. The gates of the transistors N6 and N7 are connected together and to an input node 26 which receives a column select signal COLSEL.

The biasing circuit 10 is comprised of a pair of N-channel MOS biasing transistors N4, N5. The transistor N4 has its drain and gate connected to the supply potential VCC and its source connected to the first bit-line 12. The transistor N5 has its drain and gate connected to the supply potential VCC and its source connected to the second bit-line 14.

In operation, the memory cell 16 is normally in one of two stable states with one side of the cell being at a high logic or "1" level and the other side of the cell being at a low logic or "$\phi$" level, or vice versa. Assume that the left side of the memory cell is at a "1" level and the right side of the memory cell is at a "$\phi$" level. When data is needed to be read from the memory cell 16, the word line 18 is activated so that the cell's data is placed on the bit-lines 12 and 14. Thus, the first sense node S$\phi$ will be sitting at a "1" second sense node S1 will be sitting at a "$\phi$". As a result, the biasing transistor N5 will be turned on, thereby creating a current path. Consequently, there will be power dissipation through the transistor N5. It will be noted that the transistor N4 is turned off so that there is no power dissipation.

If the left side of the memory cell is at the "$\phi$" level and the right side is at the "1" level, then the biasing transistor N4 would be turned on and there would be power dissipation through the transistor N4. In any event, one of the biasing transistors will always be biasing high the bit-line the memory cell is holding "low" so as to cause unwanted power dissipation therethrough. After the data is read, the equilibration signal BLEQ is applied so as to connect the bit-lines 12 and 14 together. As a result, the bit-lines are returned to the equilibration voltage in preparation for the next read cycle.

Figure 2:
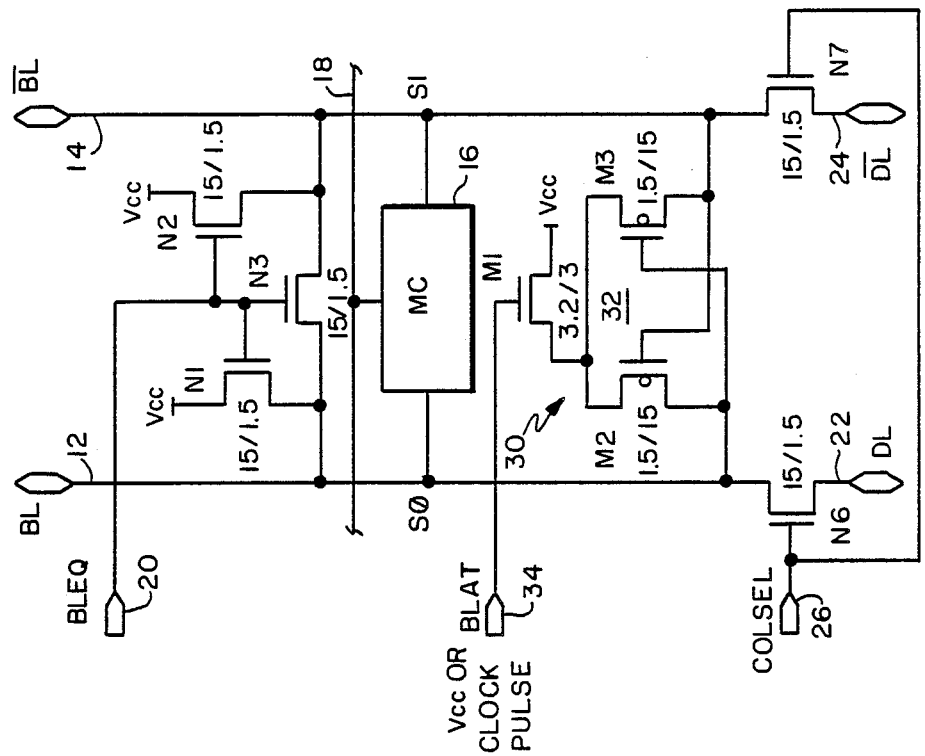
FIG. 2 is a schematic circuit diagram of a biasing circuit for biasing a pair of bit-lines, constructed in accordance with the principles of the present invention.

In FIG. 2, there is shown a schematic circuit diagram of a biasing circuit 30 of the present invention for biasing a pair of bit-lines 12, 14 in intermittent memories such as a FIFO memory array. It is to be understood that in a dual-port memory array such as a FIFO there would be additional bit-line pairs, each coupled to other biasing circuits similar to that shown in FIG. 2, and that there would be additional memory cells coupled between the bit-lines 12 and 14 than the one shown in FIG. 2. Further, some functions related to the overall operation of the memory array, not particularly relevant to the understanding of the operating principles of the present invention, have been purposely omitted for the sake of clarity. In contrast to the prior art biasing circuit 10, the biasing circuit 30 biases continuously the bit-lines 12 and 14 in the memory array so as to compensate for leakage of current without consuming any power. The biasing circuit 30 is comprised of an N-channel MOS biasing transistor M1 and a cross-coupled half-latch circuit 32 formed of a pair of P-channel MOS transistors M2 and M3.

The biasing transistor M1 has its drain connected to a supply potential VCC and its source connected to the sources of the latch transistors M2 and M3. The gate of the biasing transistor M1 is connected to the supply potential VCC via an input node 34. The latch transistor M2 has its gate connected to the drain of the latch transistor M2 and to the bit-line 14. The latch transistor M3 has its gate connected to the drain of latch transistor M2 and to the bit-line 12. The biasing transistor M1 serves to bias the common sources of the latch transistors M2 and M3 at a threshold drop $V_{tn}$ below the supply potential VCC or $V_{bias} = VCC - V_{tn}$, where $V_{tn}$ is a body-effect enhanced threshold. This bias voltage $V_{bias}$ is desired for cell stability and to facilitate fast read and write operations. The latch transistors serve to hold the state of the bit-lines 12 and 14. Further, the latch transistors prevent power dissipation by turning off a direct path between the supply potential VCC and ground. These transistors M2 and M3 are designed to be relatively small in size so as to provide low cost and a weak drive, thus avoiding the slowing down of the read or write operation.

Alternatively, the gate of the biasing transistor M1 may be connected via the input node 34 to receive clock pulses from a clock generator (not shown) rather than being tied to the supply potential VCC. In this case, the biasing transistor M1 would be activated by the clock pulses once the bit-lines 12 and 14 have settled and would be deactivated during the time when the equilibration signal BLEQ is applied.

The read operation of the memory cell 16 of FIG. 2 will now be described. During a read operation, the memory cell 16 will pull one of the bit-lines to a low logic or "$\phi$" level and will leave the other one of the bit-lines at a high logic or "1" level. Assume that the left side of the memory cell is at the low logic level and the right side of the memory cell is at the high logic level. When the word line 18 is activated, the first sense node S$\phi$ will be placed at the low logic level and the second sense node S1 will be placed at the high logic level.

As a result, the high logic level on the bit-line 14 will be applied to the gate of the P-channel latch transistor M2, thereby turning off the same. Thus, no current will be drawn through the transistor M2. On the other hand, the low logic level on the bit-line 12 will be applied to the gate of the P-channel latch transistor M3 which turns on the transistor M3. This causes the transistor M3 to hold the bit-line 14 to the high logic level or the bias voltage $V_{bias}$ at which point the transistor M3 will be turned off.

Any leakage of charge from bit-line 14 will lower the voltage on the bit-line 14 so as to cause the transistor M3 to turn back on. This will, in turn, cause the bit-line 14 to be pulled back up to the bias voltage $V_{bias}$. As can thus be seen, since there is no path to ground on the bit-line 14, no power will be dissipated through the transistor M3, except for any leakage current which is quite negligible.

From the foregoing detailed description, it can thus be seen that the present invention provides an improved biasing circuit for use with memory cells in FIFO memories which compensate for leakage on bit-lines without consuming any power. The biasing circuit of the present invention includes an N-channel MOS biasing transistor and a cross-coupled half-latch circuit formed of a first P-channel MOS transistor and a second P-channel MOS transistor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A biasing circuit for use with memory cells in memories in which data can be written into and sensed in the memory cell, comprising in combination:
a memory cell (16) being coupled with a word line and between first and second bit-lines (12, 14) at corresponding first and second sense nodes;
an N-channel MOS biasing transistor (M1) having its gate and drain connected to a supply potential (VCC); and
a cross-coupled half-latch circuit (32) formed of a first P-channel MOS transistor (M2) and a second P-channel MOS transistor (M3), said first P-channel transistor (M2) having its source connected to the sources of said second P-channel transistor (M3) and said N-channel transistor (M1), said first P-channel transistor (M2) having its gate connected to the drain of said second P-channel transistor (M3) and to said second bit-line (14), said second P-channel transistor (M3) having its gate connected to the drain of said first P-channel transistor (M2) and to said first bit-line (12),
whereby said first and second P-channel transistors (M2, M3) bias continuously said bit-lines during a read operation so as to compensate for leakage without consuming any power.

2. A biasing circuit as claimed in claim 1, wherein the drain of said N-channel transistor (M2) provides a bias voltage ($V_{bias}$) which is equal to one threshold drop below the supply potential (VCC).

3. A biasing circuit for use with memory cells in memories in which data can be written into and sensed in the memory cell, comprising in combination:
a memory cell (16) being coupled with a word line and between first and second bit-lines (12, 14) at corresponding first and second sense nodes;
an N-channel MOS biasing transistor (M1) having its gate connected to receive a clocked signal and its drain connected to a supply potential (VCC); and
a cross-coupled half-latch circuit (32) formed of a first P-channel MOS transistor (M2) and a second P-channel MOS transistor (M3), said first P-channel transistor (M2) having its source connected to the sources of said second P-channel transistor (M3) and said N-channel transistor (M1), said first P-channel transistor (M2) having its gate connected to the drain of said second P-channel transistor (M3) and to said second bit-line (14), said second P-channel transistor (M3) having its gate connected to the drain of said first P-channel transistor (M2) and to said first bit-line (12),
whereby said first and second P-channel transistors (M2, M3) bias continuously said bit-lines during a read operation so as to compensate for leakage without consuming any power.

* * * * *